(12) United States Patent
Isebrand et al.

(10) Patent No.: US 8,436,433 B1
(45) Date of Patent: May 7, 2013

(54) UNATTACHED CONTAINED SEMICONDUCTOR DEVICES

(75) Inventors: Scott D. Isebrand, Minneapolis, MN (US); Nghia T. Dinh, Burnsville, MN (US); Andrew S. Paule, Minneapolis, MN (US); Ben P. Fok, Apple Valley, MN (US)

(73) Assignee: Rosemount Aerospace Inc., Burnsville, MI (US)

( * ) Notice: Subject to any disclaimer, the term of this patent is extended or adjusted under 35 U.S.C. 154(b) by 33 days.

(21) Appl. No.: 13/272,613

(22) Filed: Oct. 13, 2011

(51) Int. Cl.
*H01L 27/14* (2006.01)
*H01L 23/02* (2006.01)
*H04R 21/02* (2006.01)
*H04R 25/00* (2006.01)

(52) U.S. Cl.
USPC ............ 257/415; 257/680; 381/360; 381/175

(58) Field of Classification Search .................... 257/415
See application file for complete search history.

(56) References Cited

U.S. PATENT DOCUMENTS

| | | | |
|---|---|---|---|
| 2002/0172384 A1* | 11/2002 | Takeuchi et al. | 381/175 |
| 2005/0094832 A1* | 5/2005 | Song et al. | 381/174 |
| 2006/0067554 A1* | 3/2006 | Halteren et al. | 381/369 |
| 2006/0157841 A1* | 7/2006 | Minervini | 257/680 |
| 2008/0247585 A1* | 10/2008 | Leidl et al. | 381/360 |
| 2008/0283988 A1* | 11/2008 | Huang et al. | 257/680 |
| 2009/0045498 A1* | 2/2009 | Braden et al. | 257/687 |
| 2009/0127697 A1* | 5/2009 | Pahl | 257/698 |

* cited by examiner

*Primary Examiner* — Long Tran
*Assistant Examiner* — Dzung Tran
(74) *Attorney, Agent, or Firm* — Edwards Wildman Palmer LLP; Scott D. Wofsy; Joshua L. Jones

(57) ABSTRACT

An unattached, contained semiconductor device includes a semiconductor die, for example a MEMS pressure sensor die. The semiconductor die is unattached from the interior cavity of a surrounding containment body in that the semiconductor die is free of adherence to the containment body to mitigate packaging stress and strain between the containment body and the semiconductor die.

20 Claims, 4 Drawing Sheets

UNATTACHED CONTAINED SEMICONDUCTOR DEVICES

BACKGROUND OF THE INVENTION

1. Field of the Invention

The present invention relates to stress mitigation in semiconductor devices, and more particularly to MEMS pressure sensor packages with packaging stress mitigation.

2. Description of Related Art

A variety of devices are known in the art for isolating semiconductor dies from packaging stress and the like. Packaging stress or mounting stress is the stress imparted on a semiconductor die by the package to which it is mounted. This can arise due to the semiconductor die having a different coefficient of thermal expansion from the packaging to which it is mounted and/or from the adhesive mounting the die to the package. In such cases, a change in temperature can cause a stress/strain on the semiconductor die, and depending on the function of the die, this stress/strain can impair performance. Packaging stress can also be caused by mechanical mounting effects from how die is mounted to the package and how the package itself is mounted in its surroundings.

In one example of packaging stress, traditional piezo resistive MEMS pressure sensor packages are designed to sense the stress on a diaphragm due to an applied pressure. It is therefore important that the only stress that the piezo resistors experience is due to the applied pressure and not to packaging stress. In such sensor packages, wherein the MEMS die is typically mounted directly to a metallic package, there can be significant packaging stress due to mechanical mounting stress and thermal expansion stress as explained above. Such sensor packages are inexpensive, but the packaging stress on the diaphragm makes pressure measurement problematic in terms of accuracy.

Typical approaches to minimize adverse packaging stress and strain include using a complaint adherence such as soft or elastomeric adhesives. This approach is fairly inexpensive and easy to manufacture and provides partial stress relief, but has certain disadvantages including processing (i.e., curing), out-gassing, inconsistent mechanical properties over temperature, and potential media incompatibility. Other approaches include fixed mounting methods such as fusion, frit, solder, braze, anodic and eutectic attachment. These can provide advantageous media compatibility, more consistent mechanical properties, and can be more robust compared to other techniques, but can cost more, can require specialized processing equipment and processes as well as higher temperature processing, and can be a potential stress inducer. Still other approaches include MEMS structure additions such as springs and mounting pedestal geometries. These techniques offer potential advantages such as springs being integral with the MEMS structure, additional stress relief may not be required, and smaller size potential. However, these techniques have disadvantages including higher development cost compared to other techniques, and mechanical resonance issues that need to be addressed. Often, multiple approaches such as those above are utilized together to address packaging stress.

For example, in some traditional MEMS pressure sensor packages, packaging stress mitigation was achieved by thickening the topping and backing wafers enclosing the diaphragm, adding a low-aspect ratio pedestal between the package and the MEMS die, and using a large, custom package to house it all. These measures have been found to provide a ten times increase of accuracy in pressure measurements made with the sensor packages so configured. However, the stress mitigation features add to the cost and size of the sensor packages.

Such conventional methods and systems have generally been considered satisfactory for their intended purpose. However, there is still a need in the art for semiconductor devices that allows for improved packaging stress mitigation such as in MEMS pressure sensors. There also remains a need in the art for such semiconductor devices that improve overall performance and are easy to make and use. The present invention provides a solution for these problems.

SUMMARY OF THE INVENTION

The subject invention is directed to a new and useful semiconductor device package having a semiconductor die. The semiconductor die is detached from the interior cavity of a surrounding containment body. The semiconductor die is free of adherence to the containment body to mitigate packaging stress and strain between the containment body and the semiconductor die.

In certain embodiments, the containment body defines an interior cavity and an exterior with a plurality of electrical contacts each extending from the interior cavity to the exterior. The semiconductor die is housed within the interior cavity with a plurality of wire bonds flexibly connecting the semiconductor die to the electrical contacts. The semiconductor is free to move within the interior cavity of the containment body accommodated by flexure of the wire bonds to mitigate packaging stress and strain between the containment body and the semiconductor.

It is contemplated that the wire bonds can provide electrical communication between the semiconductor die and the electrical contacts, and can be the only fixed mechanical connection between the containment body and the semiconductor die. The interior cavity includes a plurality of interior surfaces and the semiconductor die includes a plurality of die surfaces, each opposed to a respective one of the interior surfaces of the interior cavity. A clearance space is defined between the semiconductor die and the interior surfaces. The respective interior surfaces of the interior cavity and the die surfaces can be configured and adapted to move relative to one another even when in contact with one another.

The clearance space can be at least partially filled with a lubricious fluid to facilitate any contacting surfaces between the semiconductor die and the surfaces of the interior cavity moving freely relative to one another. The clearance between the interior cavity and the semiconductor die can be sufficient to allow for at least three axes of translational movement of the semiconductor die relative to the interior cavity. The clearance can be dimensioned to limit movement of the semiconductor die in all three axes relative to the interior cavity to a predetermined degree to protect the wire bonds from damage due to over flexure.

It is contemplated that in certain embodiments the containment body includes a base mounted to a cap. The base includes the electrical contacts and at least one surface of the interior cavity. The cap includes at least one surface of the interior cavity. The semiconductor die includes a MEMS pressure sensor, and at least one of the base and cap of the containment body includes an aperture therethrough from the interior cavity to the exterior. The aperture can be covered by a diaphragm for communication of ambient pressure to the MEMS pressure sensor.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION OF THE PREFERRED EMBODIMENTS

Figure 1:
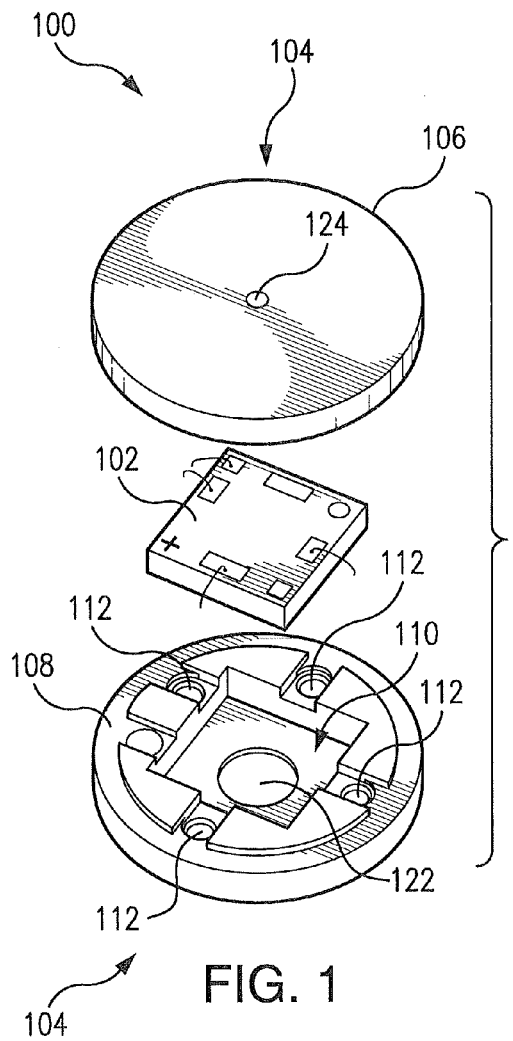
FIG. 1 is an exploded perspective view of an exemplary embodiment of a semiconductor device package constructed in accordance with the present invention, showing the containment body separated from the semiconductor die as viewed from above.

Reference will now be made to the drawings wherein like reference numerals identify similar structural features or aspects of the subject invention. For purposes of explanation and illustration, and not limitation, a partial view of an exemplary embodiment of a semiconductor device package in accordance with the invention is shown in FIG. 1 and is designated generally by reference character 100. Other embodiments of packages in accordance with the invention, or aspects thereof, are provided in FIGS. 2-8, as will be described. The systems and methods of the invention can be used to mitigate packaging stress for semiconductor devices, such as MEMS dies.

Referring to FIG. 1, semiconductor device package 100 includes a semiconductor die 102 and a containment body 104 having cap 106 and a base 108. When package 100 is assembled with die 102 therein, die 102 is detached or unattached from interior cavity 110 formed in the surrounding containment body 104 in that die 102 is free of adherence to containment body 104. Since die 102 is free from direct adherence or positive affixing to containment body 104, die 102 is free to move within interior cavity 110 to mitigate packaging stress and strain between containment body 104 and semiconductor die 102.

Figure 2:
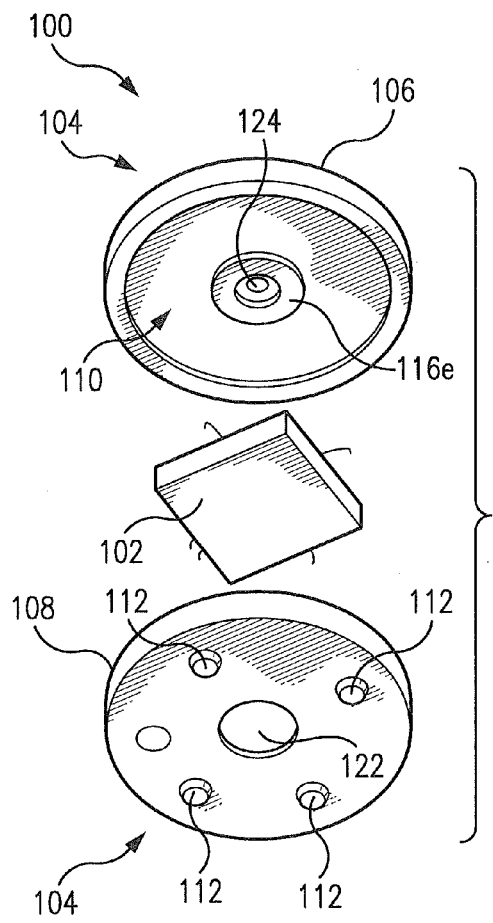
FIG. 2 is an exploded perspective view of the semiconductor device package of FIG. 1, showing the containment body and semiconductor die as viewed from below.
Figure 4:
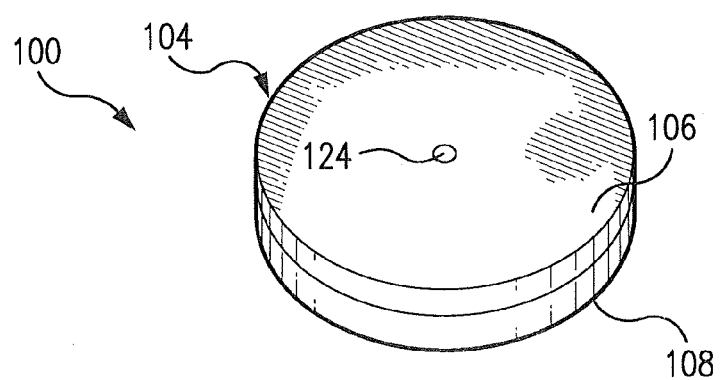
FIG. 4 is a perspective view of the semiconductor device package of FIG. 1, showing the base and cap of the containment body joined together.

As shown in FIG. 1, a portion of interior cavity 110 is formed in the base 108 of containment body 104, and as shown in FIG. 2, a portion of interior cavity 110 is formed in cap 106. FIG. 4 shows device package 100 with cap 106 and base 108 assembled together to form containment package 104 about die 102, which is blocked from view in FIG. 4. Semiconductor die 102 includes a MEMS pressure sensor, which is configured for absolute pressure measurements. A pressure aperture 122 is provided through base 108, and another pressure aperture 124 is provided through cap 106 for fluid communication of external pressures through containment package 104 to the MEMS pressure sensor within interior cavity 110.

Figure 3:
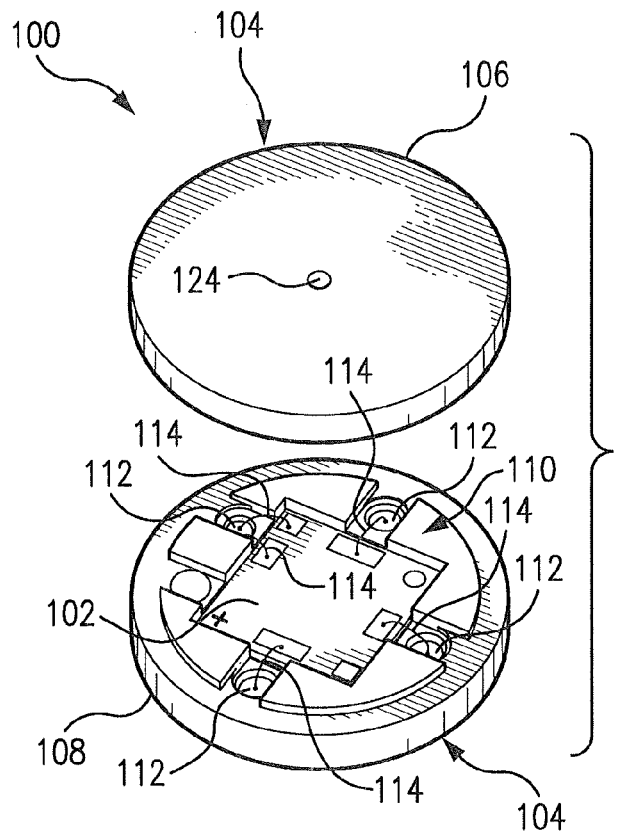
FIG. 3 is an exploded perspective view of the semiconductor device package of FIG. 1, showing the semiconductor die seated in the base of the containment body.

Base 108 of containment body 104 includes four electrical contacts 112 each extending from interior cavity 110, as indicated in FIG. 1, to the exterior of containment body 104, as indicated in FIG. 2. Optionally, the plurality of electrical contacts can be separate from the containment body or be a part of the sensor package. Cap 106 could optionally have electrical contacts as well. Referring to FIG. 3, when assembled, semiconductor die 102 is housed within interior cavity 110 with a plurality of wire bonds 114 flexibly connecting semiconductor die 102 to electrical contacts 112. Wire bonds 114 are the only fixed connection between containment body 104 and semiconductor die 102. Die 102 is thus free to move within interior cavity 110 due the flexibility of wire bonds 114.

Figure 8:
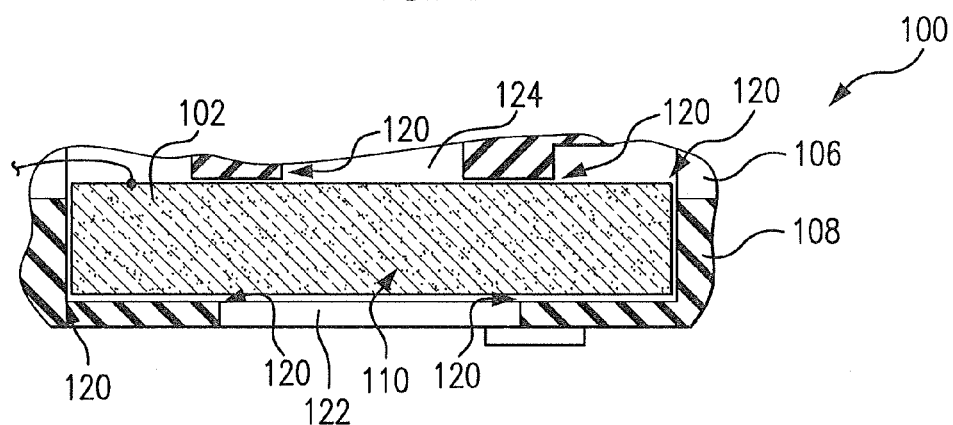
FIG. 8 is an enlarged cross-sectional elevation view of a portion of the semiconductor device package of FIG. 6, showing the clearance space between the semiconductor die and the containment body.

With reference now to FIGS. 5-8, interior cavity 110 includes a plurality of interior surfaces 116a-116f formed in cap 106 and base 108. Semiconductor die 102 includes a plurality of respective die surfaces 118a-118f, each opposed to a respective one of the interior surfaces 116a-116f of interior cavity 110. Interior surfaces 116a-116d are identified in FIG. 5, as are the respective die surfaces 118a-118d. Interior surfaces 116e-116f are identified in FIGS. 6 and 7, as are respective die surfaces 118e-118f. A clearance space 120, identified in FIG. 8, is defined between semiconductor die 102 and the interior surfaces 116a-116f of interior cavity 110.

A portion of clearance space 120 is defined between each respective pair of die and interior cavity surfaces, namely between surfaces 116a and 118a, between surfaces 116b and 118b, between surfaces 116c and 118c, between surfaces 116d and 118d, between surfaces 116e and 118e, and between surfaces 116f and 118f.

The respective interior surfaces 116a-116f of interior cavity 110 and die surfaces 118a-118f are configured and adapted to move relative to one another even when in contact with one another. Since semiconductor die 102 can move within interior cavity 110, depending on how it is situated at any given time, it can rest against one or more of surfaces 116a-116f with clearance space 120 defined between the corresponding non-contacting surfaces 116a-116f and 118a-118f. Clearance space 120 can optionally be at least partially filled with a lubricious fluid, such as an oil, to facilitate free movement between any contacting surfaces 118a-118f and 116a-116f relative to one another. If lubricious fluid is used, apertures 122 and/or 124 can optionally be covered by a diaphragm for communication of ambient pressure to the MEMS pressure sensor without loss of lubricious fluid. If a diaphragm is used, it can advantageously be in the form of a membrane suitably thin to avoid false back pressure from thermal expansion of the lubricious fluid, for example.

Figure 5:
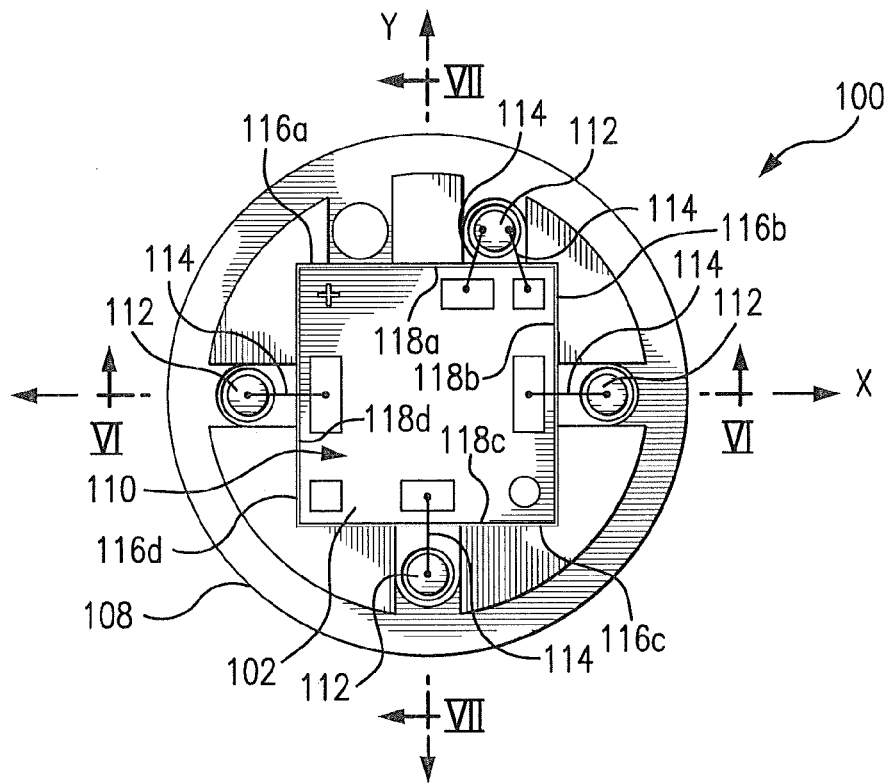
FIG. 5 is a plan view of the semiconductor device package of FIG. 1, showing the semiconductor die seated in the base of the containment body with the cap of the containment body removed.
Figure 6:
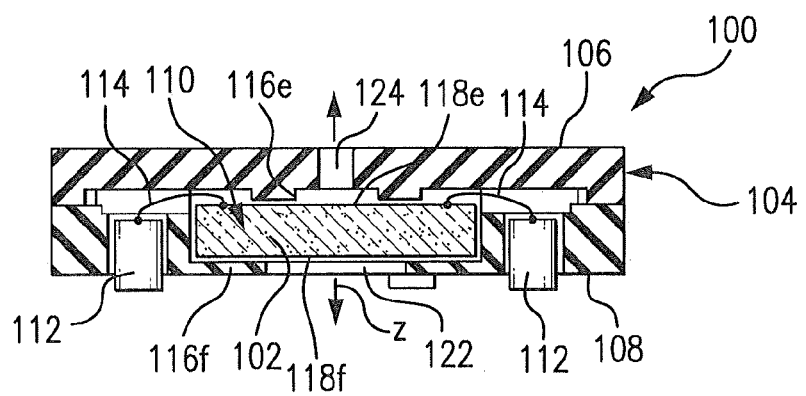
FIG. 6 is a cross-sectional elevation view of the semiconductor device package of FIG. 1, showing the semiconductor die and containment body at the cross-section indicated in FIG. 5.
Figure 7:
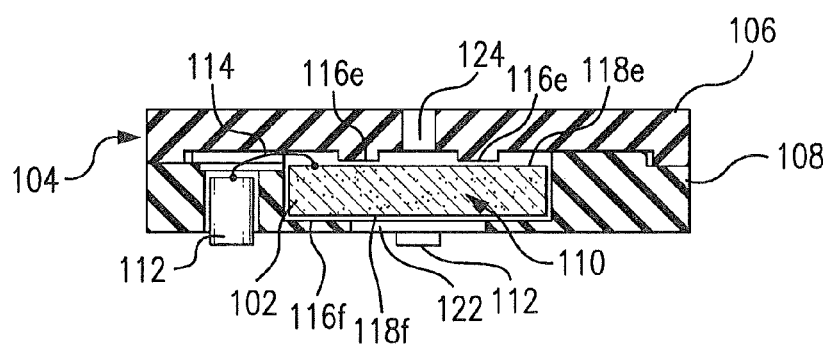
FIG. 7 is a cross-sectional elevation view of the semiconductor device package of FIG. 1, showing the semiconductor die and containment body at the cross-section indicated in FIG. 5.

Clearance space 120 provides sufficient clearance between interior cavity 110 and semiconductor die 102 to allow for at least three axes of translational movement of semiconductor die 102 relative to interior cavity 110, i.e. along orthogonal axes x and y shown in FIG. 5 and additional orthogonal axis z in FIG. 6, and also to allow for rotation about the same three axes. The clearance of clearance space 120 is also dimensioned to limit translation and rotation movement of semiconductor die 102 in all three axes relative to interior cavity 110 to a predetermined degree to protect wire bonds 114 from damage due to over flexure. In other words, clearance space 120 is large enough to allow for some movement of die 102 within interior cavity 110 to mitigate packaging stress, but is small enough to prevent excessive movement of die 102 to preserve wire bonds 114. The dimensions of clearance space 120, as well as the size and composition of wire bonds 114, and can be configured from application to application to advantageously account for both fatigue and elastic strain limitations to ensure suitably long life in wire bonds 114. The lubricious fluid mentioned above, if used, can provide a dampening effect for movement of die 102 to help ruggedize against mechanical shock and vibration, which can further serve to protect wire bonds 114.

In assembling package 100, die 102 is placed into the interior cavity portion base 108 without adhesive. The connections of wire bonds 114 are made between die 102 and electrical contacts 112 of base 108. During the formation of wire bond connections, it is important to maintain die position in space such as to allow the required void space 120 around die 102, e.g., adjacent to surfaces 118a-118d, so that when the wire bond connections are complete, wire bonds 114 will not be over stressed or damaged during environmental exposure due to movement of die 102 within interior cavity 110, e.g., so that the wire bonds have enough play. Typical wire bonding processes work best when the target die is mounted rigidly during the bonding process. Since die 102 is not rigidly attached to base 108, a temporary fixture can be inserted in clearance space 120 adjacent surfaces 118a-118d to temporarily hold die 102 in place during the wire bonding process. Once the wire bond connections are complete and any temporary fixtures have been removed, cap 106 can be attached to base 108 without adhesive bonding between cap 106 and die 102. Die 102 is then fully contained within containment body 104 without being adhered thereto. Containment body 104 can then be placed in a sensor package without packaging stress and strain related issues.

It is contemplated that containment body 104 including cap 106 and base 108 can be made of plastics and can be machined to provide the internal cavity features described above. It is also contemplated that containment body 104 can itself be formed as a MEMS device together with, or in a separate process from die 102. Any other suitable materials and processes can be used to fabricate containment body 104 and die 102 without departing from the spirit and scope of the invention. The shape of containment body 104 can be circular as shown in FIGS. 1-8, or can be of any other suitable shape as needed from application to application.

The exemplary devices described above are suitable for environmental exposures such as vibration, mechanical shock, and temperature variation, while eliminating undesired stress and strain effects associated with typical MEMS die attachment. This mitigates time and temperature varying stress and strain effects on the die arising from attachment methods. Thus, die containment rather than attachment provides the ruggedized implementation of MEMS straining devices, for example. The lack of mechanical coupling or adhesion between the strain sensing device and containment structure improves long term stability of MEMS devices compared to traditional techniques.

While shown and described in the exemplary context of MEMS pressure sensors, those skilled in the art will readily appreciate that the packaging stress isolation systems and methods described above can readily be applied to any suitable devices. For example, the systems and methods described above can be applied to MEMS gyros, MEMS accelerometers, electronics chips, or any other suitable devices where packaging stress is an issue that can affect performance. In the case of MEMS accelerometers, for example, the clearance gap between the die and the interior cavity has to be dimensioned to be suitable for the application, e.g., so that arbitrary movement of the die within the interior cavity is negligible with respect to the acceleration being measured.

The methods and systems of the present invention, as described above and shown in the drawings, provide for contained semiconductor devices with superior properties including mitigation of packaging stress for improved accuracy and reliability, for example in MEMS pressure sensors. While the apparatus and methods of the subject invention have been shown and described with reference to preferred embodiments, those skilled in the art will readily appreciate that changes and/or modifications may be made thereto without departing from the spirit and scope of the subject invention.

What is claimed is:

1. A semiconductor device package comprising:
   a containment body defining an interior cavity and an exterior with a plurality of electrical contacts each extending from the interior cavity to the exterior; and
   a semiconductor die housed within the interior cavity with a plurality of wire bonds flexibly connecting the semiconductor die to the electrical contacts, wherein the semiconductor die is not attached to any portion of the interior cavity and the semiconductor die is free to move within the interior cavity of the containment body accommodated by flexure of the wire bonds to mitigate packaging stress and strain between the containment body and the semiconductor.

2. A semiconductor device package as recited in claim 1, wherein the interior cavity includes a plurality of interior surfaces and the semiconductor die includes a plurality of die surfaces, each opposed to a respective one of the interior surfaces of the interior cavity, wherein the respective interior surfaces of the interior cavity and the die surfaces are configured and adapted to move relative to one another even when in contact with one another.

3. A semiconductor device package as recited in claim 1, wherein the interior cavity includes a plurality of interior surfaces and a clearance space is defined between the semiconductor die and the interior surfaces, and wherein the clearance space is at least partially filled with a lubricious fluid to facilitate any contacting surfaces between the semiconductor die and the surfaces of the interior cavity moving freely relative to one another.

4. A semiconductor device package as recited in claim 1, wherein there is a clearance between the interior cavity and the semiconductor die to allow for at least three axes of translational movement of the semiconductor die relative to the interior cavity.

5. A semiconductor device package as recited in claim 4, wherein the clearance is dimensioned to limit movement of the semiconductor die in all three axes relative to the interior cavity so as to maintain positional and spatial alignment and orientation of the semiconductor die relative to external containment features to a predetermined degree to protect the wire bonds from damage due to over flexure.

6. A semiconductor device package as recited in claim 1, wherein the containment body includes a base mounted to a cap, wherein the base includes the electrical contacts and at least one surface of the interior cavity, and wherein the cap includes at least one surface of the interior cavity.

7. A semiconductor device package as recited in claim 6, wherein the semiconductor die includes a MEMS pressure sensor, and wherein at least one of the base and cap of the containment body includes an aperture therethrough from the interior cavity to the exterior, the aperture being covered by a diaphragm for communication of ambient pressure to the MEMS pressure sensor.

8. A semiconductor device package comprising:
a containment body defining an interior cavity and an exterior with a plurality of electrical contacts each extending from the interior cavity to the exterior; and
a semiconductor die in electrical communication with the electrical contacts of the containment body by way of a plurality of flexible wire bonds, wherein the wire bonds are the only fixed connection between the containment body and the semiconductor die, wherein the semiconductor die is not attached to any portion of the interior cavity and the semiconductor die is free to move within the interior cavity of the containment body accommodated by flexure of the wire bonds to mitigate packaging stress and strain between the containment body and the semiconductor die.

9. A semiconductor device package as recited in claim 8, wherein the interior cavity includes a plurality of interior surfaces and the semiconductor die includes a plurality of die surfaces, each opposed to a respective one of the interior surfaces of the interior cavity, wherein the respective interior surfaces of the interior cavity and die surfaces are configured and adapted to move relative to one another even when in contact with one another.

10. A semiconductor device package as recited in claim 8, wherein the interior cavity includes a plurality of interior surfaces and a clearance space is defined between the semiconductor die and the interior surfaces, and wherein the clearance space is at least partially filled with a lubricious fluid to facilitate any contacting surfaces between the semiconductor die and the surfaces of the interior cavity moving freely relative to one another.

11. A semiconductor device package as recited in claim 8, wherein there is a clearance between the interior cavity and the semiconductor die to allow for at least three axes of translational movement of the semiconductor die relative to the interior cavity.

12. A semiconductor device package as recited in claim 11, wherein the clearance is dimensioned to limit movement of the semiconductor die in all three axes relative to the interior cavity so as to maintain positional and spatial alignment and orientation of the semiconductor die relative to external containment features to a predetermined degree to protect the wire bonds from damage due to over flexure.

13. A semiconductor device package as recited in claim 8, wherein the containment body includes a base mounted to a cap, wherein the base includes the electrical contacts and at least one surface of the interior cavity, and wherein the cap includes at least one surface of the interior cavity.

14. A semiconductor device package as recited in claim 13, wherein the semiconductor die includes a MEMS pressure sensor, and wherein at least one of the base and cap of the containment body includes an aperture there through from the interior cavity to the exterior, the aperture being covered by a diaphragm for communication of ambient pressure to the MEMS pressure sensor.

15. A semiconductor device package comprising:
a containment body defining an interior cavity and an exterior with a plurality of electrical contacts each extending from the interior cavity to the exterior; and
a semiconductor die housed within the interior cavity wherein the semiconductor die is detached from the interior cavity and is free of adherence thereto to mitigate packaging stress and strain between the containment body and the semiconductor die.

16. A semiconductor device package as recited in claim 15, wherein the interior cavity includes a plurality of interior surfaces and the semiconductor die includes a plurality of die surfaces, each opposed to a respective one of the interior surfaces of the interior cavity, wherein the interior surfaces of the interior cavity and the respective die surfaces are configured and adapted to move relative to one another even when in contact with one another.

17. A semiconductor device package as recited in claim 15, wherein the interior cavity includes a plurality of interior surfaces and a clearance space is defined between the semiconductor die and the interior surfaces, and wherein the clearance space is at least partially filled with a lubricious fluid to facilitate any contacting surfaces between the semiconductor die and the surfaces of the interior cavity moving freely relative to one another.

18. A semiconductor device package as recited in claim 15, wherein there is a clearance between the interior cavity and the semiconductor die sufficient to allow for at least three axes of translational movement of the semiconductor die relative to the interior cavity, and wherein the clearance is dimensioned to limit movement of the semiconductor die in all three axes relative to the interior cavity so as to maintain positional and spatial alignment and orientation of the semiconductor die relative to external containment features.

19. A semiconductor device package as recited in claim 15, wherein the containment body includes a base mounted to a cap, wherein the base includes at least one surface of the interior cavity, and wherein the cap includes at least one surface of the interior cavity.

20. A semiconductor device package as recited in claim 15, wherein the semiconductor die includes a MEMS pressure sensor, and wherein at least one of the base and cap of the containment body includes an aperture therethrough from the interior cavity to the exterior, the aperture being covered by a diaphragm for communication of ambient pressure to the MEMS pressure sensor.

\* \* \* \* \*